US008066559B2

(12) United States Patent
Cochrane

(10) Patent No.: US 8,066,559 B2
(45) Date of Patent: Nov. 29, 2011

(54) IN-PLANE AIRFLOW CIRCULATION CONTINGENCY AND CONTROL SYSTEM

(75) Inventor: Paul Douglas Cochrane, Fremont, CA (US)

(73) Assignee: Stealthdrive, Inc., Alexandria, VA (US)

( * ) Notice: Subject to any disclaimer, the term of this patent is extended or adjusted under 35 U.S.C. 154(b) by 1158 days.

(21) Appl. No.: 11/720,335

(22) PCT Filed: Jun. 13, 2006

(86) PCT No.: PCT/US2006/022894
§ 371 (c)(1),
(2), (4) Date: May 28, 2007

(87) PCT Pub. No.: WO2006/138256
PCT Pub. Date: Dec. 28, 2006

(65) Prior Publication Data
US 2008/0160896 A1    Jul. 3, 2008

Related U.S. Application Data

(60) Provisional application No. 60/690,066, filed on Jun. 13, 2005.

(51) Int. Cl.
*F24F 7/00* (2006.01)
(52) U.S. Cl. .................................................. 454/259
(58) Field of Classification Search .............. 454/259; F24F 7/00, 13/12
See application file for complete search history.

(56) References Cited

U.S. PATENT DOCUMENTS

| 2,649,272 | A | * | 8/1953 | Barbato | 251/212 |
| 2,830,617 | A | * | 4/1958 | Brown | 137/553 |
| 3,101,736 | A | * | 8/1963 | Egger | 137/242 |
| 3,159,179 | A | * | 12/1964 | De Lain | 137/545 |
| 3,680,471 | A | * | 8/1972 | Rosendale | 454/259 |
| 3,773,253 | A | * | 11/1973 | Laven | 494/4 |
| 4,122,668 | A | * | 10/1978 | Chou et al. | 60/792 |
| 6,796,328 | B2 | * | 9/2004 | Myles | 137/557 |
| 7,045,235 | B2 | * | 5/2006 | Arthur | 429/434 |
| 7,255,012 | B2 | * | 8/2007 | Hedtke | 73/861.61 |
| 7,326,108 | B2 | * | 2/2008 | Matthews et al. | 454/259 |
| 2006/0261303 | A1 | * | 11/2006 | Thomas et al. | 251/212 |

FOREIGN PATENT DOCUMENTS
JP  03241256 A  * 10/1991

* cited by examiner

*Primary Examiner* — Steven B McAllister
*Assistant Examiner* — Frances H Kamps
(74) *Attorney, Agent, or Firm* — Stealthdrive, Inc.; David Dort

(57) ABSTRACT

The invention eliminates recirculation or back draft associated cooling air flows in systems that use two or more cooling fans/blowers (or other possible cooling devices). The inventive device with accomplish this by mean of an "Iris-like" in-plane device. The solution described herein is to be passive in nature (although it could be made to respond to electronic or other signals/commands/control mechanisms) and will be capable of responding to a filed fan/blower and engage at the time of fan/blower failure simply by detecting the change of pressure associated with the failed cooling device. The inventive device will reduce the space required and the cost associated with back draft damping or recirculation. In addition, the device can be retrofitted to existing systems and can be designed to be an integral part of a finger guard (a safety feature) of a cooling fan. The device will also provide acoustic advantages of more traditional back draft or recirculation as the Iris will retract completely out of the airflow during normal operation and therefore not result in the acoustic vibrations associated with many of the existing solutions.

10 Claims, 8 Drawing Sheets

IN-PLANE AIRFLOW CIRCULATION CONTINGENCY AND CONTROL SYSTEM

REFERENCE TO PRIORITY DOCUMENTS

This patent application claims priority under 35 USC §119 (e) to U.S. Provisional Application 60/690,066, filed in the USPTO on Jun. 13, 2005 and entitled "IRIS cooling air recirculation management device", which is incorporated by reference in its entirety, for all purposes.

FIELD OF THE INVENTION

The present invention relates generally to all electro-mechanical systems that employ two or more cooling devices, for which recirculation or "back draft" of the cooling circulation air would be detrimental to the performance, reliability or life of the system. The present invention, (as referred to by the trade-name "The IRIS™") can be employed in the design of most or all systems requiring cooling devices and can be retrofitted to many existing systems that require back draft or recirculation management.

BACKGROUND

When cooling electronic or other systems, for which temperature regulation is required, it is often necessary to employ multiple cooling devices (fans, blowers, etc. . . . ). In the event that one or more of the cooling devices fail, there is often a need to prevent the recirculation of cooling air between active the remaining operational devices and those (1 or more—most often only 1, which will be replaced with routine maintenance) which have failed. To illustrate this please refer to prior art FIG. 1, in which a standard prior art ventilation flow is shown. The desired rotation of the fan rotor I indicated by the number "1" and the associated desired airflows are indicated by the green arrows. When the fan fails the rotor will rotate in the opposite direction, indicated by the number "2" and the associated undesirable airflows are indicated by the arrows. The entire recirculation (or back flow) loop is now established. The majority of the related prior art solutions employ devices such as louvers (indexed as "L") or vanes to relieve the recirculation issue.

Prior art FIG. 2 illustrates a "vanes" or "louvers" thermal solution. In this prior art solution, when the fan is operation under normal conditions, there are louvers (or vanes) that rotate to a position that I perpendicular to the desired airflow and on "fan failure" the louvers/vanes fall to cover the face of the fan that would be on the downstream side of the airflow, when under normal operating conditions.

One of the problems with the vanes or louvers is that they require space that is downstream of the fan, noted as FP(2) or "footprint" and that this space is wasted. In addition, vanes often become an issue from the perspective of acoustic noise, due to vibration of the vanes when floating in the airflow from the cooling devices.

SUMMARY OF THE INVENTION

The present invention (also referred to by the trade-name IRIS™) provides a solution for the management of recirculation, or backflow/backdraft damping, requiring very little space, as it resides in a "thin" plane at the exhaust of the fan(s). As such, there is little space dedicated to the device and therefore the solution is valuable as this space can be reserved for more value added system components. In addition, the IRIS recirculation solution is passive in a preferred embodiment, to reduce complexity and further increase the value of the device. The passive solution will use the air pressure of the fan(s) to retract the components of the IRIS or "petals" inward to the hub of the fan(s), while they are in normal operating mode.

In the event of fan failure, the IRIS petals will "migrate" in a thin plane outward to completely cover the annular ring which corresponds to the actual airflow region of the fan. The manner in which the petals will migrate is based on a tension interference between adjacent petals that will drive the petals outward once the pressure, associated with normal fan operation, has ceased (i.e. on fan failure). The use of air pressure to keep the IRIS™ in an "open" position, provides a very valuable aspect of the IRIS solution, as it can react to the failure of a fan automatically and, in a first embodiment, only requires the normal airflow dynamics to do so. During normal operation, a feature on the petals will have a force component, caused by the pressure of the fan airflow, which drives the petals radially inward to the hub of the fan(s).

As the IRIS solution retracts completely from the airflow when the fan(s) are in so-called normal operation, there usually is no acoustic issue. Another advantage of the present invention is that the recirculation device has been created to be easily incorporated in new system designs and also the easily retrofitted to existing systems.

The principles of the invention are also broadly applicable to other technical areas, such as telecom, datacom, PC's and other systems that employ multiple cooling devices all would derive benefit from the solution of the present invention.

BRIEF DESCRIPTION OF THE DRAWINGS

Various other objects, features and attendant advantages of the present invention will become fully appreciated as the same becomes better understood when considered in conjunction with the accompanying drawings, in which.

DETAILED DESCRIPTION OF THE DRAWINGS

Figure 2:
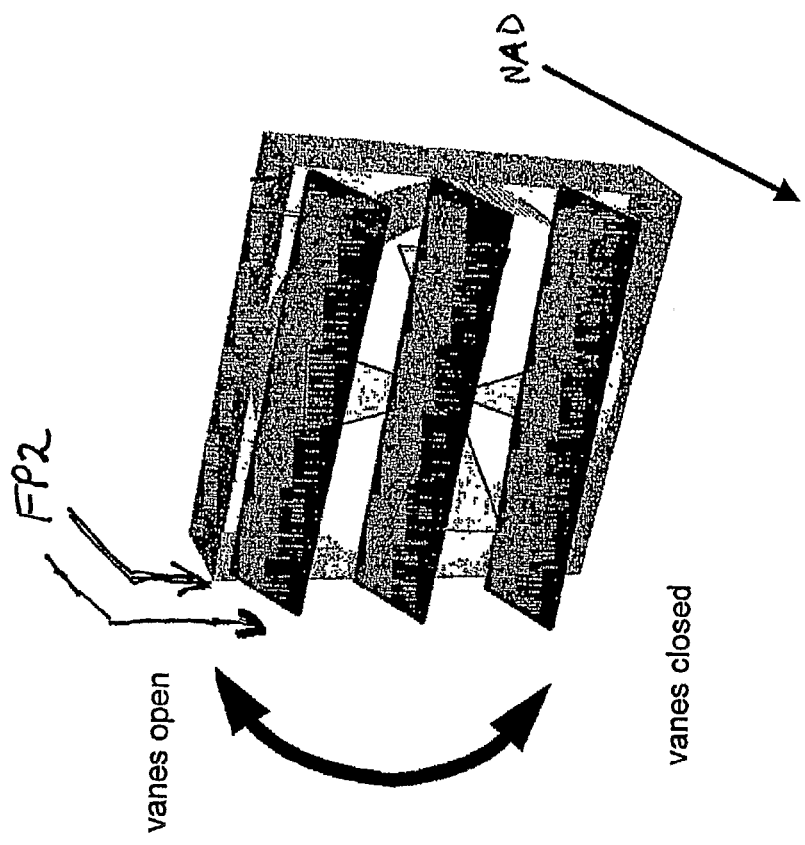
FIG. 2 illustrates a prior art circulation device using vanes or louvers.
Figure 1:
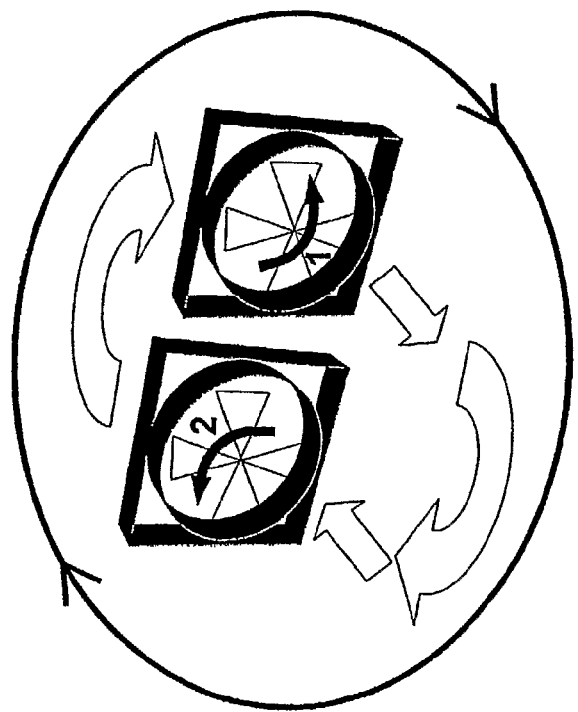
FIG. 1 shows a prior art circulation system.

The invention may be embodied in the form illustrated in the accompanying drawings, attention being called to the fact that the drawings are illustrative only, and that changes may be made to the specific configurations illustrated without departing from the spirit and scope of the invention. The invention is capable of other embodiments and of being practiced and carried out in various ways. Also, it is to be understood that the phraseology and terminology employed herein are for the purpose of the description and should not be regarded as limiting.

Turning now descriptively to the drawings, in which similar reference characters denote similar elements throughout the several views, the attached figures illustrate a methodology for managing recirculation of cooling air which can occur on the failure of one, or more, cooling devices.

Figure 9:
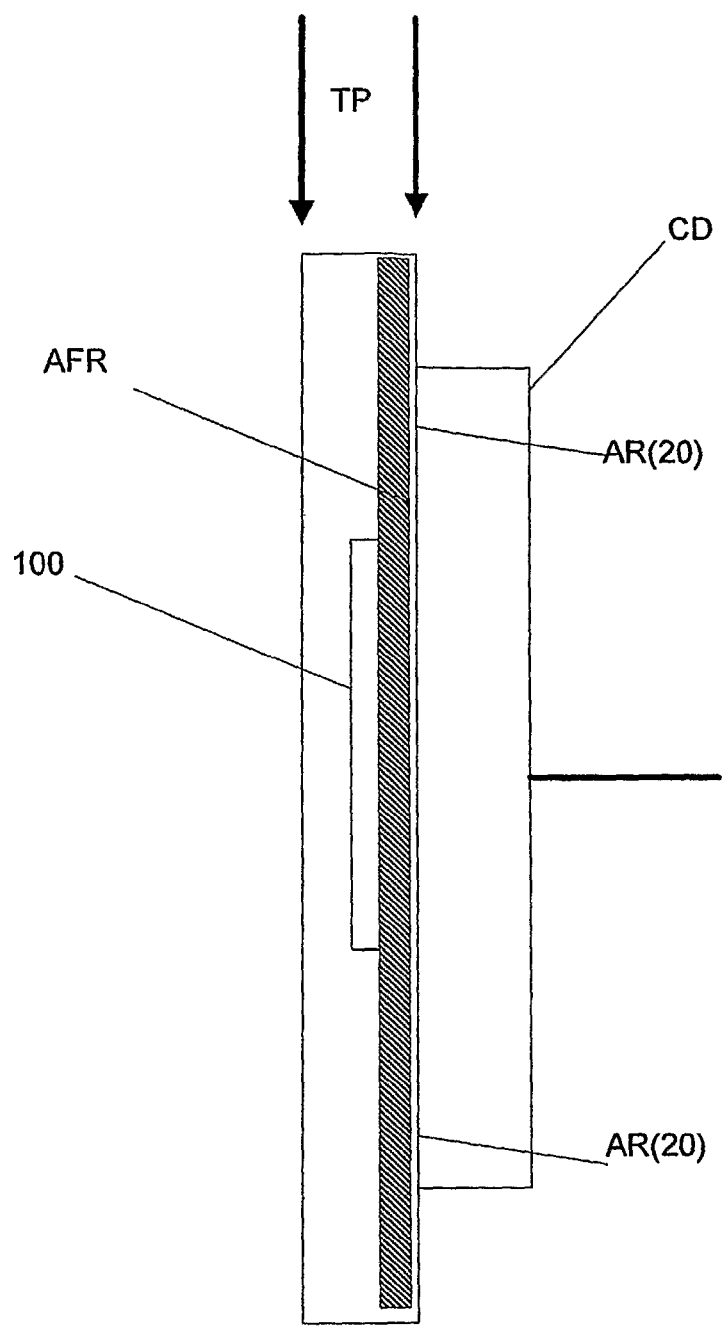
FIG. 9 illustrates general operational principles and space configuration of the invention.

Referring to FIG. 9, the present invention or IRIS™ solution 100 for the management of recirculation, or back flow/draft damping, requires very little space, as it resides in a "thin" plane at the exhaust of the fan(s) TP. As such, there is little space dedicated to the device and therefore the solution is valuable as this space can be reserved for more value added system components. The passive solution will use the pressure of the fan(s) to retract the IRIS petals inward to the hub of the fan(s) CD, while they are in normal operating mode. On fan failure, the IRIS petals will migrate outward to completely cover the annular ring AR or 20, which is the actual airflow region of the fan AFR. The manner in which the petals will migrate is based on a spring interference between adjacent petal that will drive the petals outward once the pressure, associated with normal fan operation, has ceased (i.e. on fan failure). This provides a very valuable aspect of the IRIS solution, as it can react to the failure of a fan automatically and only requires the normal airflow dynamics of the fan to operate, as during "normal" operation, a feature on the petals will have a force component, caused by the pressure of the fan airflow, which drives the petals radially inward to the hub of the fan(s).

The present invention recirculation device has been created to be easily incorporated in new system designs and also can be easily retrofitted to existing systems. The optional retro-fit features are shown below in FIGS. 8A-B.

Figure 3A:
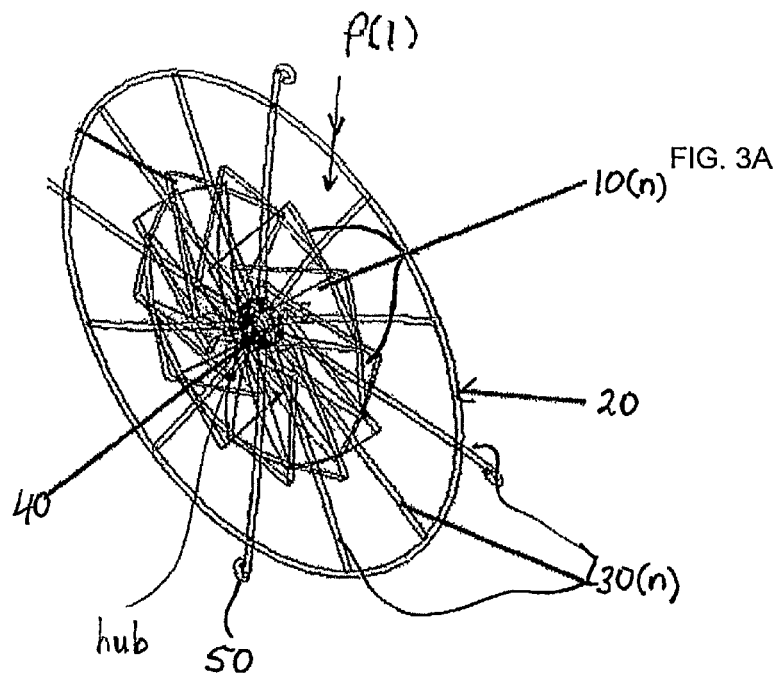
FIG. 3A illustrates a perspective view of an embodiment of the invention in a normal operation.

Referring now to FIG. 3A, an illustration of a particular and generally preferred embodiment of the invention is shown in a hidden line mode. The IRIS™ 100, is shown in a first, or "fan operational" or "normal" position, thus, the IRIS 100 will allow the air flow to proceed as "normal" in the first position.

The particular embodiment shown in FIG. 3A (through 3C) includes a set of one more spokes 30(1) . . . 30(n) of the IRIS mounting assembly. In a preferred embodiment, there are between 4 and 16 spokes, which may vary depending on the size and end-use of the recirculation management device. In the preferred embodiment, a Hub 40 is used to connect the spokes 30(n) radially of the IRIS mounting assembly.

Figure 5A:
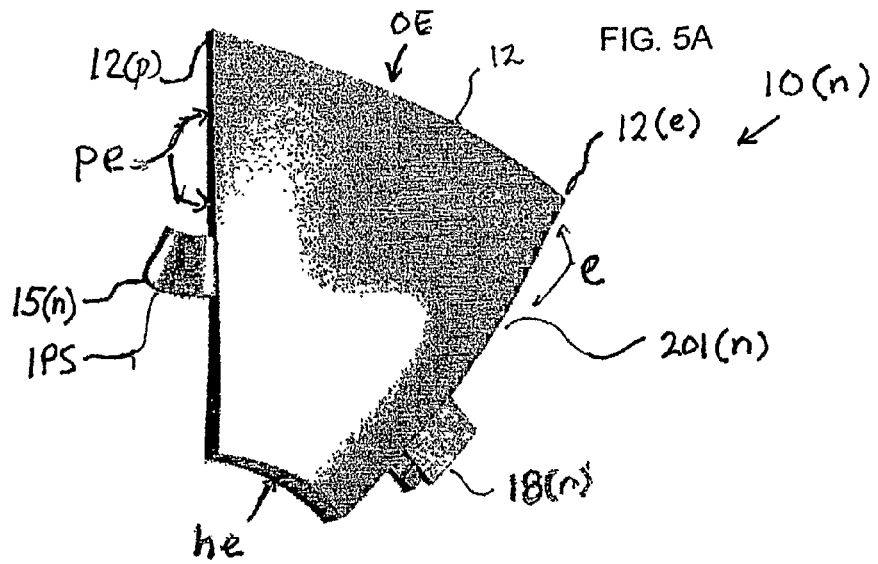
FIG. 5A illustrates a front perspective view of a petal in a particular embodiment.
Figure 5B:
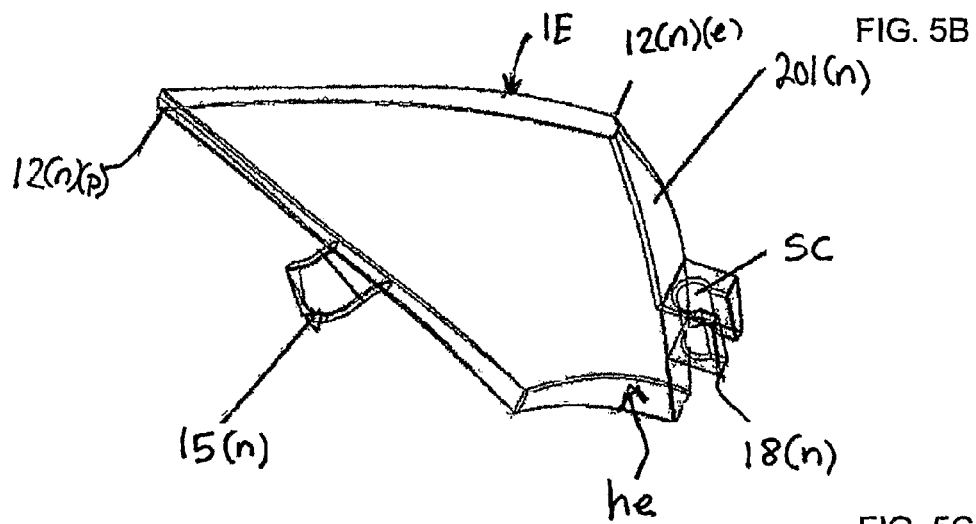
FIG. 5B illustrates a side perspective view of the petal.
Figure 5C:
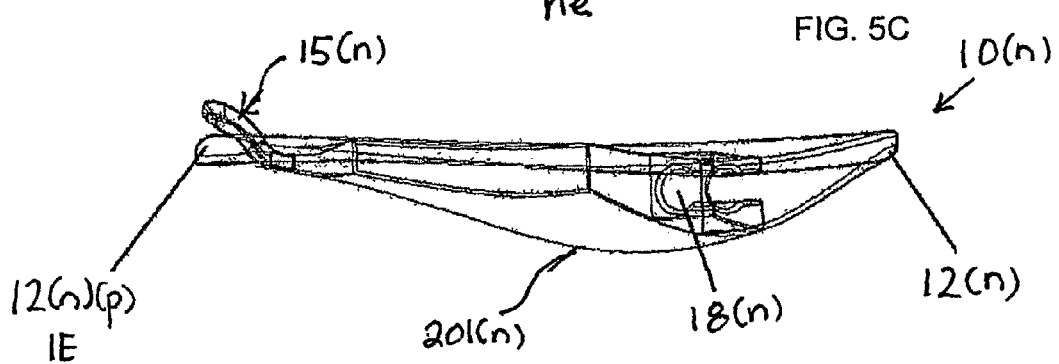
FIG. 5C illustrates a back perspective view of the petal.

A preferred embodiment has a set of "movable" petals 10(1) . . . 10(n), which will migrate from the region in front of the hub of the fan P(1), during "normal" operation, to the annular ring which is the region in which the air exhausts from a cooling device, under normal operating (fan operational) conditions. FIG. 3A also shows an outer member of the frame 20 of the mounting assembly for the IRIS device. The outer member 20 usually takes the 30(1) . . . 30(n) set of spokes, either through a slot or direct attachment during assembly. Specific details of the petals 10(1) . . . 10(n) are shown in FIGS. 5A-C.

Figure 8A:
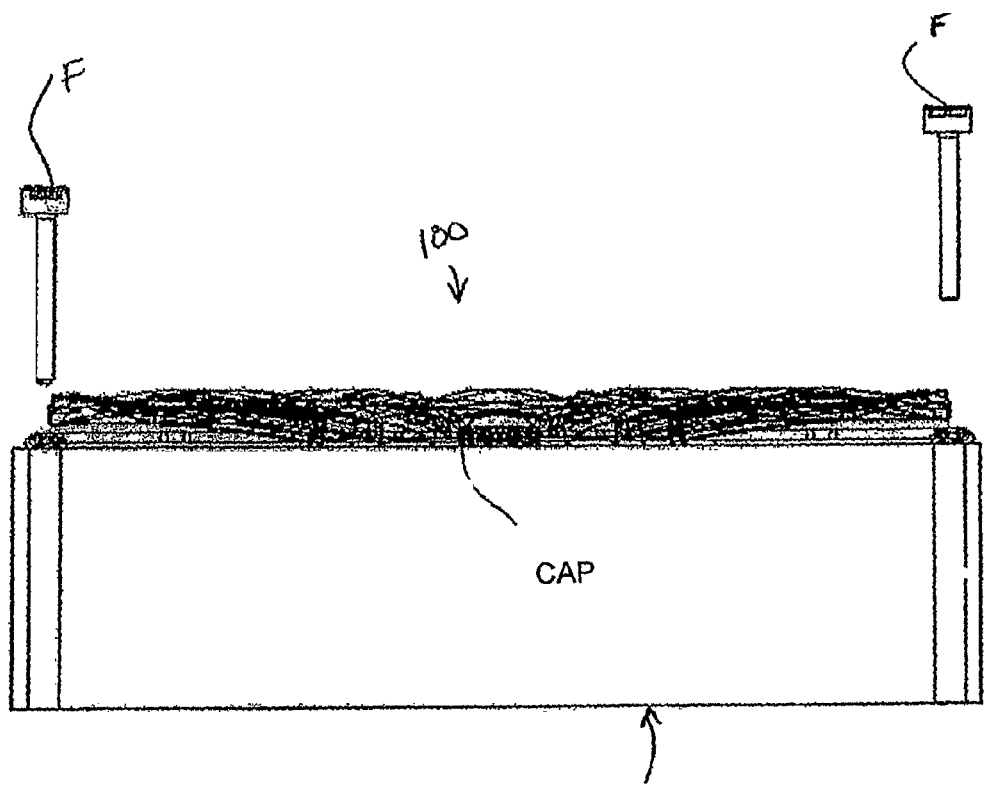
FIG. 8A illustrates a side view of a sample assembly with optional features of alternate embodiments.
Figure 8B:
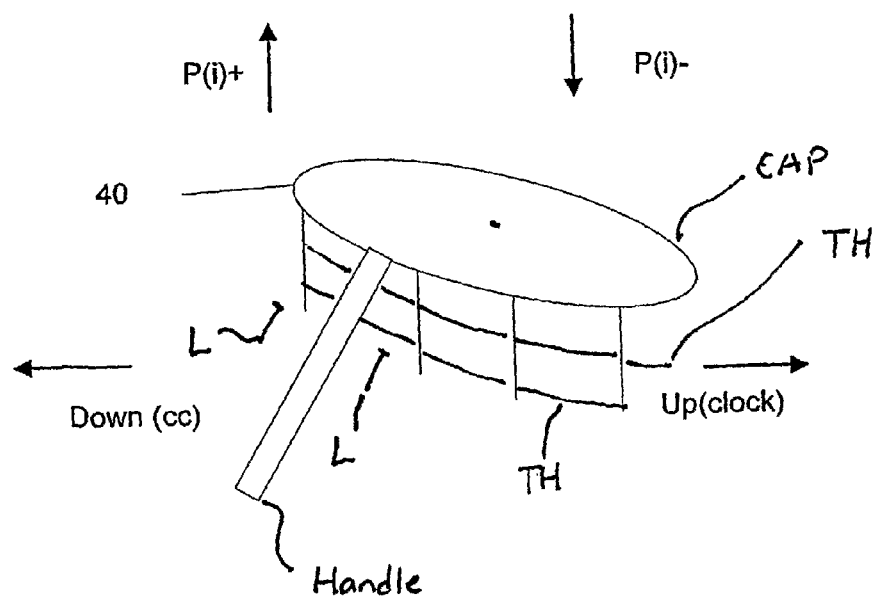
FIG. 8B illustrates a detail view of the optional feature of the manual pressure/coefficient friction setting.

Also shown in FIG. 3A, is an optional attachment feature 50 that would be used to mount the IRIS assembly to a fan, or other cooling device. The attachment device 50, may be in the form of hooks or clips, but also may be in the form of an adhesive attachments as well. Optional configurations of the are shown in FIGS. 8A and B in which the in-plane retrofittable recirculation device may be directly applied or built into the ventilation panel (not shown) without departing from the spirit and scope of the invention.

Figure 3B:
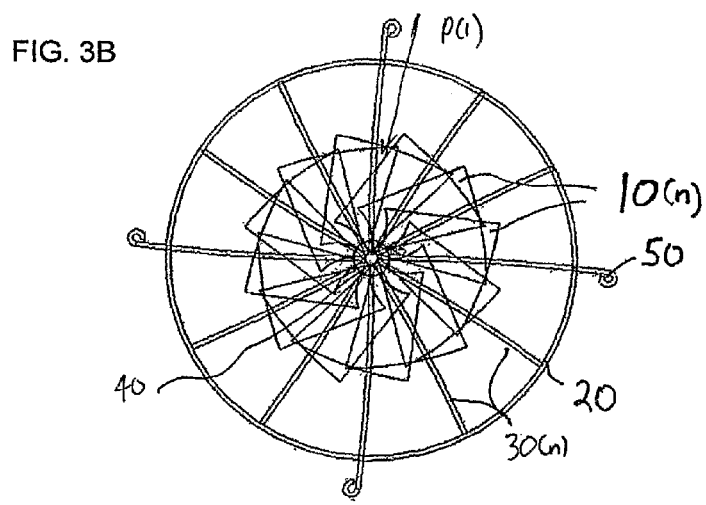
FIG. 3B is a front view of the invention in a normal operation.
Figure 3C:
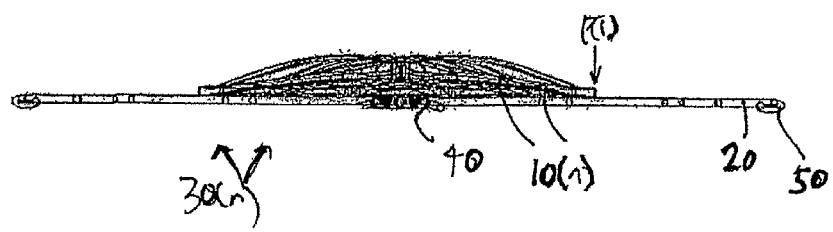
FIG. 3C is a side view of the present invention in a normal operation.

FIG. 3B shows the normal mode of the recirculation management system 100 from a front view, and FIG. 3C shows the normal mode of a first embodiment of the invention 100 from a side view.

Figure 4A:
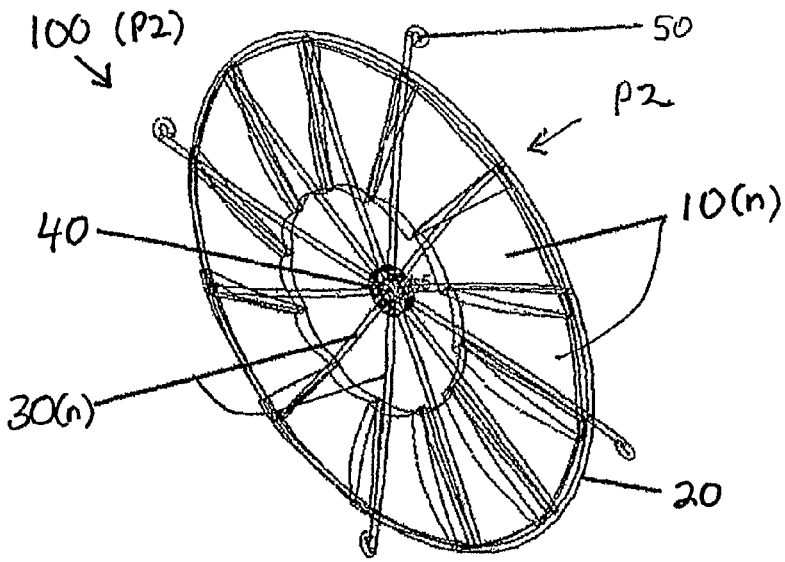
FIG. 4A illustrates a perspective view of the present invention in a fan fail mode.
Figure 4B:
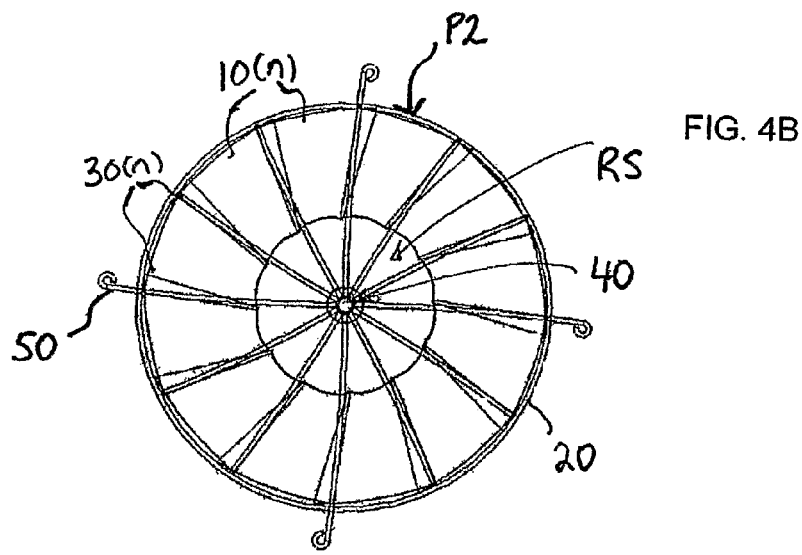
FIG. 4B illustrates a frontal view of the invention in a fan fail mode.
Figure 4C:
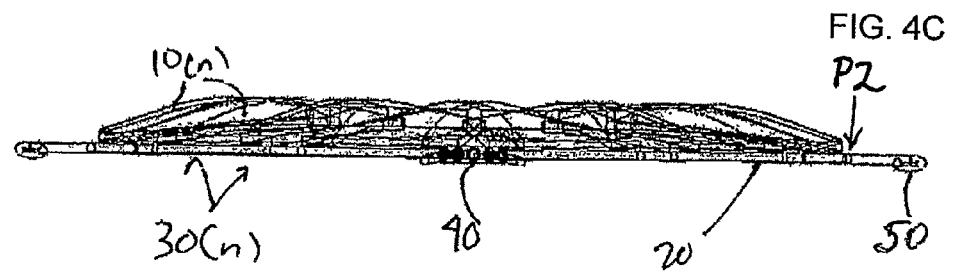
FIG. 4C illustrates a side view of the invention in a fan fail mode.

FIGS. 4A-4C illustrate a preferred embodiment of the invention, in a second position or "fan fail mode." The contingency recirculation system 100 moves to the "second position" or "closed" in order to prevent damaging recirculation. FIG. 4A illustrates the petals 10(1) . . . 10(n) having now migrated to the closed position towards the outer member 20 along the "thin plane" and guided by the spokes 30(1) . . . 30(n). Thus, the petals 10(1) . . . 10(n) have also not only moved radially outward, but they have also spread out to increase the surface area coverage and prevent backflow. In general, the petals can increase in surface area because of their convex configuration (see FIGS. 5A-C, below), but other shapes may be used as well without departing from the spirit and scope of the invention.

Referring now to FIGS. 5A-5C, the details of a petal 10(n) in a first embodiment is shown. The outward edge of the petal 12(n) is shaped in a generally convex configuration so as to cause it to "interleave" over the adjacent petal (see FIG. 3A) when being driven into the first or normal operating position, over the fan hub. For reference, the petal 10(n) also has a "p" edge, an "e" edge or "exertion" edge and a "hub" edge.

An in-plane stabilizer 15(n) holds the petal 10(n) in plane with the other petals (not shown), and is generally located on the side of the petal that is not constrained by the mounting assembly spokes or the "p" edge of the petal.

The outward edge 12(n(e)) of the petal that is shaped to cause it to interleave over the adjacent petal (not shown) when being driven into the normal operating position by the air pressure, over the fan hub (not shown). A slide clip 18(n) is the structure that constrains the petals 10(n) to slide radially outward (from first position to second position) and inward (from second position to first position) along the mounting assembly spokes (30(n) as shown in FIGS. 3a-4c).

FIG. 5A shows the portion of the IRIS petal 201 (n), that will exert the force on the adjacent petal (not shown), which will force it to migrate radially outward to the second position, once the cooling air pressure is removed, when the fan(s) fail.

FIG. 5B shows a side view of the petal 10(n) illustrated in FIG. 5A, and FIG. 5C shows a back perspective view of the petal 10(n) illustrated in FIG. 5A.

A primary embodiment of the invention utilizes a "spring effect" by forcing adjacent (either on one side or both, depending on the end-use requirements), petals, such as 10(1) and 10(2) (see FIG. 7A) to be under pressure when they interleave over each other. The pressure of the cooling air flow (Pa(air)) will be greater than the pressure or "tension" between adjacent petals and therefore will overcome this spring force, during normal operation, but on fan fail this spring force will cause the petals to migrate outward and defeat any issues associated with recirculation or back-flow/draft damping of cooling devices/systems.

Figure 6B:
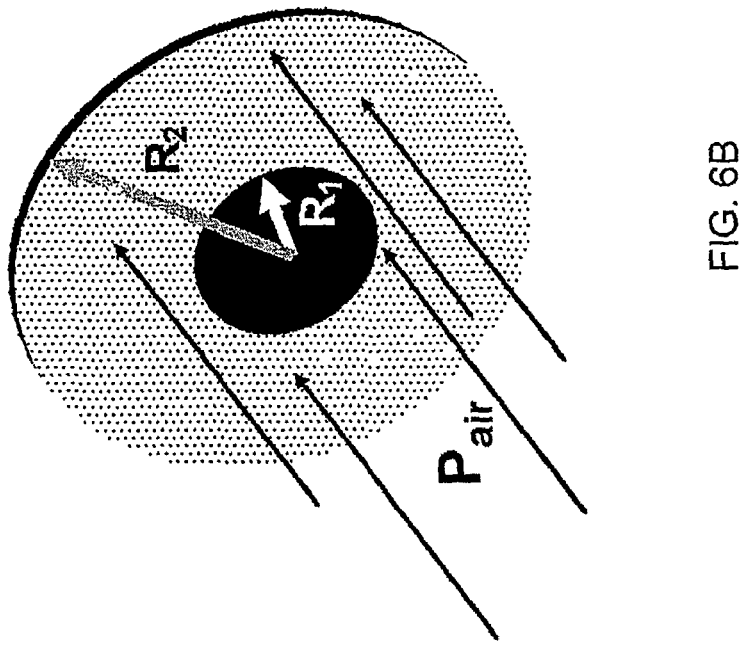
FIG. 6B illustrates the pressure forces at work, in an embodiment of the invention.
Figure 6A:
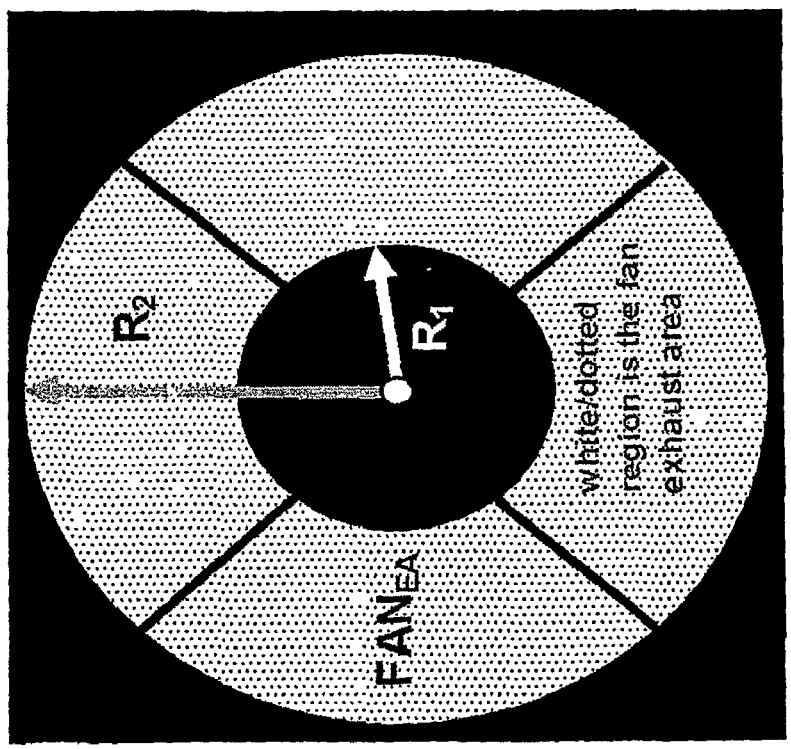
FIG. 6A illustrates the concept of exhaust area as it may be used in the present invention.

As illustrated by FIGS. 6a-6b, the region of the IRIS petals that will have the pressure of the cooling airflow force the petals into the hub R(c), therefore out of the path of the cooling air, under normal operating conditions. These features will have no impact once the cooling air pressure is removed, i.e. in the case fan experiences failure.

The amount of "pressure" exerted on the contingency ventilation system can vary with the end use. However, depending on the end-use needs, the "tension" the holds the petals in the second position can be dynamic or static. In a first embodiment, the tension will be static, but adjustable.

FIGS. 6a and 6b show a general illustration of the pressure force from the ventilation air on the contingency airflow management device.

R(1) is the radius (area) of the IRIS. R(2) is the radius (area) of the fan exhaust area;

P(air) is the pressure of the air from the ventilation unit.

$$Fan(EA)=*(R2-R1)^2; F(air)=P(air) \times Fan(EA);$$

Figure 7A:
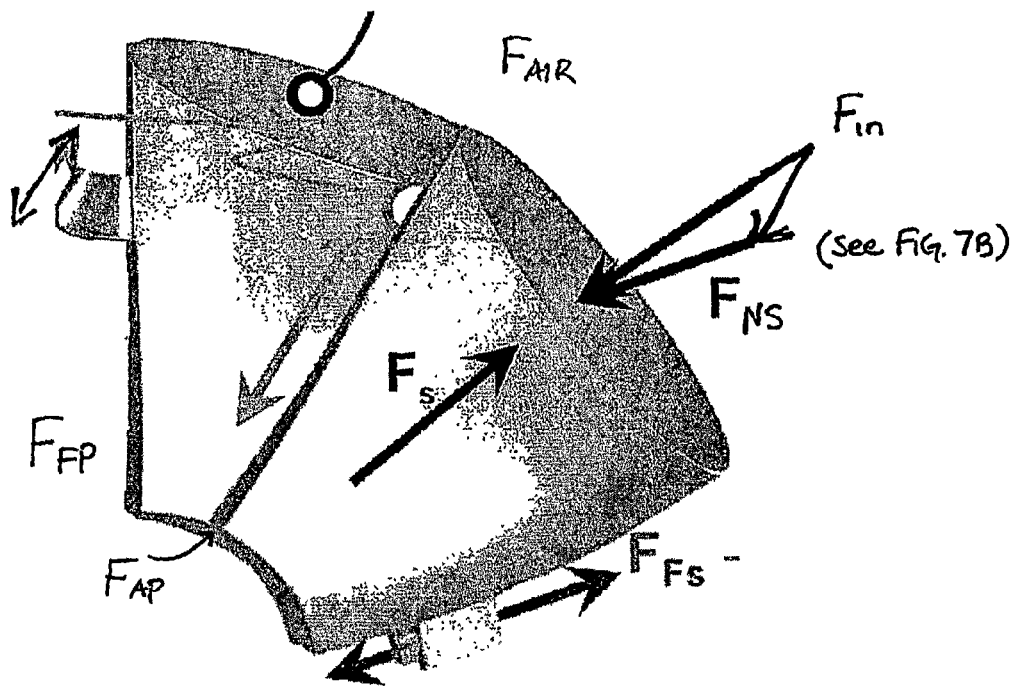
FIG. 7A illustrates a first diagram regarding the pressure forces on the petals.
Figure 7B:
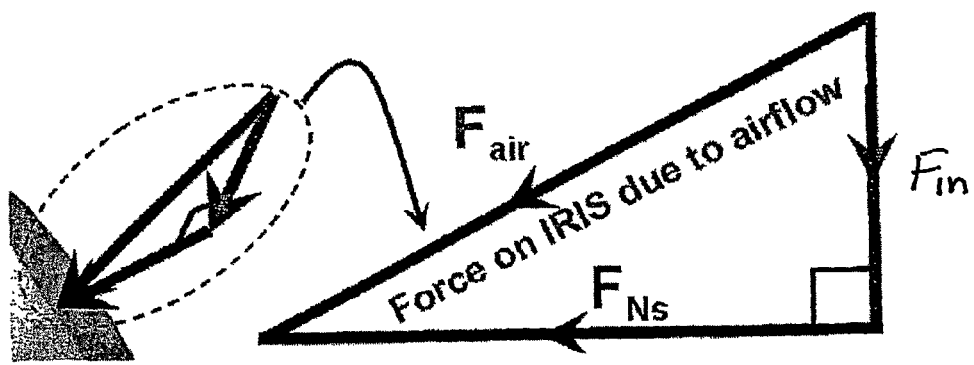
FIG. 7B illustrates a second diagram regarding the pressure forces on the petals.

Variables include altitude, variable fan speeds and fan fail thresholds θ(fail);

As the IRIS moves from one position to another ($1^{st}$ to $2^{nd}$ mainly) the surface area of the IRIS will vary FIGS. 7a and 7b show a preferred embodiment in which the air pressure from the fan keeps the contingency ventilation device in an "open" position. The counter-force is defined the amount of air pressure force (N/m2) that it takes to keep the device open. As such, FIGS. 7a and 7b refer to the forces that act upon the petals to keep them in the first (fan fail) or second (fan operational) position.

Where:

F(fp) is the force of friction between two adjacent petals.

F(air) is the total force on a given petal as a result of the airflow pressure (see FIGS. 6A and B).

F(in) is the component of airflow force vector acting radially inward.

F(ns) is the component of the airflow force vector which result in the petal to petal spring force F(s).

F(fs) is the friction force between the petals assembly feature and the frame spokes;

F(fo) is the friction force on petal overlap features;

There is also an aerodynamically designed feature that will introduce the F(in) force component.

As shown in FIG. 7B, the forces work in such a fashion that:

to open the IRIS, the general equation of the simple forces is:

$$F(s) > F(fp) + F(fo) + F(fs);$$

and to close the IRIS, the general principles in a first embodiment are: F(in)>F(s)+F(fp)+F(fs)+F(fo), where the static (μ(s)) and kinetic (μ(k)) friction coefficients of the materials being used are "to be determined" and considered under all predicted operating conditions, mainly for temperature. Of course, in alternate embodiments, the status and operating conditions may be automatically configured or "set" such that the friction forces may be determined automatically or by manual calculation. However, it is expected that certain conditions for the calculation of the friction coefficients will be standardized to the point where an adjustment device may be including as a screw-pressure like device (such as threaded shaft on the hub) on an alternate embodiment of the invention shown CAP shown in FIG. 8a, and shown in detail in FIG. 8B. The pressure adjustment device CAP may have "lockable" standardized settings or be continuous. In the optional embodiment shown moving the handle in one direction increased the spring tension on the petals and moving the handle in the other decreases the spring tension on the petals. Thus, the recirculation management device may be spot-tested for the particular fan device as well as account for temperature and pressure variations and well as things like altitude.

A primary embodiment of the invention accomplishes recirculation management by means of an "Iris-like" solution. The solution described herein is to be passive in nature (although it could be made to respond to electronic or other signals/commands/control mechanisms) and will be capable of responding to a filed fan/blower and engage at the time of fan/blower failure simply by detecting the change of pressure associated with the failed cooling device. The inventive device will reduce the space required and the cost associated with back draft damping or recirculation. In addition, the device can be retrofitted to existing systems and can be designed to be an integral part of a finger guard (a safety feature) of a cooling fan. The device will also provide acoustic advantages of more traditional back draft or recirculation as the Iris will retract completely out of the airflow during normal operation and therefore not result in the acoustic vibrations associated with many of the existing solutions.

As such, the embodiment of the invention shown in the accompanying drawings is for illustrative purposes only, and is not meant to be limiting. As such, it is to be understood that the invention is not limited in its application to the details of construction and to the arrangements of the components set forth in the following description or illustrated in the drawings. Also, it is to be understood that the phraseology and terminology employed herein are for the purpose of the description and should not be regarded as limiting, but is provided for understanding the invention.

I claim:

1. A system for providing contingency ventilation for an electronic device including:
    an inner hub radially connecting a set of spokes, said set of spokes supporting an outer mounting frame;
    a set of retractable petals, each one of said set of petals including sliding hub connector that slides radially along one of said set of spokes;
    wherein each of said set of petals is held in an open position by air pressure of a ventilation device located externally;
    wherein said set of petals slides to an outer portion of said spoke when said air pressure is absent, creating a change in airflow.

2. The system for providing contingency ventilation as recited in claim 1, further comprising at least one clip for mounting.

3. The system as recited in claim 1, wherein each of said set of retractable petals has an interleaving edge that moves at least one other of said set of petals when retracting.

4. The system as recited in claim 3, wherein said petals can retract in a thin plane.

5. The system as recited in claim 1, wherein each of said set of petal further includes an in-plane stabilizer.

6. A contingency air circulation system, including:
    a set of petals held by an amount of tension in an outward position, each one of said set of petals connected to a spoke extending radially from an interior hub to an outer circumferential frame said outward position at an outermost position on said spoke;
    wherein when a pressure of a cooling air flow is greater than a pressure between adjacent petals and therefore overcomes said amount of tension, said petals move to an inward position along said spokes towards a hub-end of said spokes;

said set of petals moving from said inward position to said outward position in a plane that is substantially perpendicular to the direction of said airflow caused by a circulation device.

7. The contingency air circulation system as recited in claim 6, where said plane is substantially parallel to the direction of the fan.

8. The contingency air circulation system as recited in claim 6, further comprising an activation mechanism, said mechanism for moving said set of petals from said outward position to said inward position.

9. The contingency air circulation system as recited in claim 7, wherein said mechanism is electrically activated.

10. The contingency air circulation system as recited in claim 7, wherein said mechanism is temperature activated.

* * * * *